US007880253B2

(12) United States Patent
Roy et al.

(10) Patent No.: US 7,880,253 B2
(45) Date of Patent: Feb. 1, 2011

(54) INTEGRATED OPTICAL FILTER

(75) Inventors: Francois Roy, Seyssins (FR); Tarek Lule, Sainte-Egreve (FR); Samir Guerroudj, Saint-Etienne (FR)

(73) Assignee: STMicroelectronics SA, Montrouge (FR)

( * ) Notice: Subject to any disclaimer, the term of this patent is extended or adjusted under 35 U.S.C. 154(b) by 207 days.

(21) Appl. No.: 12/157,936

(22) Filed: Jun. 13, 2008

(65) Prior Publication Data
US 2009/0008730 A1 Jan. 8, 2009

Related U.S. Application Data

(63) Continuation-in-part of application No. 11/605,832, filed on Nov. 28, 2006, now abandoned.

(51) Int. Cl.
*H01L 21/76* (2006.01)
(52) U.S. Cl. .................. 257/432; 257/290; 257/294; 257/E21.13; 257/E21.002; 438/48; 438/52; 438/70
(58) Field of Classification Search ......... 257/290–294, 257/350, 432; 438/69–70, 59–60, 65, 73
See application file for complete search history.

(56) References Cited

U.S. PATENT DOCUMENTS 7,110,034 B2 * 9/2006 Suda ........................... 348/340
7,615,399 B2 * 11/2009 Lee ............................. 438/70
2002/0063214 A1 * 5/2002 Hsiao et al. ............... 250/338.4
2006/0006438 A1 * 1/2006 Maruyama .................. 257/294

FOREIGN PATENT DOCUMENTS

JP 2004 281911 10/2004

OTHER PUBLICATIONS

T. H. Hsu et al., "Color Mixing Improvement of CMOS Image Sensor with Air-Gap-Guard Ring in Deep-Submicrometer CMOS Technology," IEEE Electron Device Letters, vol. 26, No. 5, May 2005, pp. 301-303.

* cited by examiner

Primary Examiner—Dung A. Le

(57) ABSTRACT

The disclosure relates to an integrated circuit comprising at least one photosensitive cell. The cell includes a photosensitive element, an input face associated with the said photosensitive element, an optical filter situated in at least one optical path leading to the photosensitive element and an interconnection part situated between the photosensitive element and the input face. The optical filter is disposed between the photosensitive element and the surface of the interconnection part closest to the input face. In particular, the optical filter can be disposed within the interconnection part. The disclosure also proposes that the filter be formed using a glass comprising cerium sulphide or at least one metal oxide.

22 Claims, 5 Drawing Sheets

INTEGRATED OPTICAL FILTER

CROSS-REFERENCE TO RELATED APPLICATIONS

This application is a continuation-in-part of application Ser. No. 11/605,832 filed Nov. 28, 2006 now abandoned, incorporated by reference herein, which claims priority under 35 U.S.C. §119(a) to French Patent Application No. 0512156 entitled "INTEGRATED OPTICAL FILTER WITHIN OR UNDER THE METALLIZATION LEVELS OF A PHOTOSENSITIVE CELL AND CORRESPONDING FABRICATION PROCESS" filed on Nov. 30, 2005, which is hereby incorporated by reference. French Patent Application No. 0512156 is assigned to the assignee of the present application and is hereby incorporated by reference into the present disclosure as if fully set forth herein. The present application hereby claims priority under 35 U.S.C. §119(a) to French Patent Application No. 0512156.

TECHNICAL FIELD

The present disclosure is generally directed to integrated circuits, and more specifically to integrated circuits having a photosensitive cell with an optical filter.

BACKGROUND

Many optical components integrate photosensitive cells that deliver an electrical signal representative of the received light intensity. Such components are, for example, optical detectors formed from a matrix of photosensitive cells, configured adjacent to one another, whose respective input faces are situated in a common plane. The cells deliver a signal that allows the detected image to be reconstituted from the location of the cells within the matrix. However, since the signal delivered is only representative of the received light intensity, the matrix does not allow discrimination between the various wavelengths detected. In order to reconstitute the colours, a possible method is to use a checkerboard of filters positioned on top of the photosensitive cells, each filter being associated with a particular photosensitive cell.

Filters are chosen to decompose any given light signal into a reduced number of wavelengths. This may, for example, be three primary colours such as blue, green and red. The filters will then be disposed in such a manner that each filter alternates with the other two allowing any given wavelength to be analysed by means of three adjacent photosensitive cells.

The filters generally used are photoresists that cannot withstand temperatures above 300° C. Since the fabrication of the metallization levels requires, amongst other operations, anneal steps at around 400° C., the filters are fabricated after the metallization levels. The filters are therefore situated above the interconnection part of the photosensitive cells, in other words on top of the elements allowing the connection of the sensitive element of the cell to the control circuit and to the data processing circuit.

Conventional connections require four to seven metallization levels. Such metallization levels create a stack that can reach 10 μm in height. In addition, in order to increase the resolution, the width of conventional photosensitive cells is decreasing. Typically, the width of the photosensitive cell may be around 2 μm. Given these dimensions, the aspect ratio (height/width) of such photosensitive cells trend to be much greater than unity, and thus leads to difficulties in fabrication and increases the risks of defects.

For such cells, the filter situated on top of the stack is too far from the sensitive element of the cell, and a light beam of relatively low angle, for example 15°, can cause an overlap of the colors, in other words a light ray passing through a given filter is not detected by the cell associated with the filter but by a neighbouring cell. Moreover, because of the reflexions by the metal of the metallization levels, a light ray passing through a given filter may be detected by a neighbouring cell. Furthermore, the photoresist filters are sensitive to high illumination which reduces their ageing, and most of these filters have also a thickness between 800 nm and 1 μm, required by their optical properties, which increases the height of the stack.

Conventional methods dispose a light guide within the thickness of the interconnection part. The light guide is placed under the filter and collects the light rays that emerge from it and guides the light to the photosensitive element of the associated cell. The guide requires additional fabrication steps which result in high production costs. Moreover, conventional methods fail address or reduce the aspect ratio of the cell.

There is therefore a need for a compact, reliable photosensitive cell with a reasonable cost of fabrication and having an excellent optical performance.

SUMMARY

This disclosure provides a compact, reliable photosensitive cell with a reasonable cost of fabrication and having an excellent optical performance.

In one embodiment, the present disclosure provides an integrated circuit having at least one photosensitive cell. The photosensitive cell includes a photosensitive element and an input face associated with the photosensitive element. The cell also includes an optical filter situated in at least one optical path leading to the photosensitive element. The cell further includes an interconnection part disposed between the photosensitive element and the input face. The optical filter is disposed between the photosensitive element and the surface of the interconnection part closest to the input face. In particular, said interconnection part may comprise at least two metallization layers separated by a dielectric layer, and the optical filter may be disposed within the interconnection part, between the photosensitive element and the metallization layer of the interconnection part closest to the input face.

In another embodiment, the present disclosure provides a method of fabricating an integrated circuit having a photosensitive element. The method includes disposing a first dielectric layer on the photosensitive element and disposing a first metallization level on the first dielectric layer. The method also includes disposing a second dielectric layer on the first metallization level. The method further includes forming a hole from a portion of the surface of the second dielectric layer opposite to the photosensitive element, in the direction of the photosensitive element. Finally, the method includes filling the hole with a material forming an optical filter.

In still another embodiment, the present disclosure provides a plurality of photosensitive cells disposed in a matrix configuration. Each of the photosensitive cells include a photosensitive element and an input face associated with the photosensitive element. The cell also includes an optical filter situated in at least one optical path leading to the photosensitive element. The cell further includes an interconnection part disposed between the photosensitive element and the input face. The optical filter is disposed between the photosensitive element and the surface of the interconnection part closest to the input face. The optical filters of the various photosensitive cells are located within at least two different metallization levels. In particular, said interconnection part may comprise at least two metallization layers separated by a dielectric layer, and the optical filter may be disposed within the interconnection part, between the photosensitive element and the metallization layer of the interconnection part closest to the input face.

Other technical features may be readily apparent to one skilled in the art from the following figures, descriptions and claims.

BRIEF DESCRIPTION OF THE DRAWINGS

FIGS. 1 to 14 are partial cross-sectional views of an integrated circuit.

Figure 1:
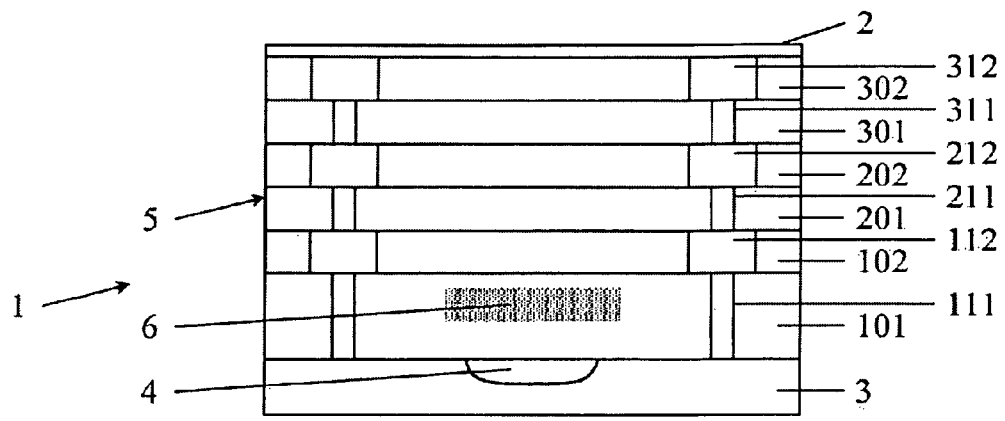
FIGS. 1 to 8 and 15 illustrate, very schematically, various embodiments of photosensitive cells.
Figure 2:
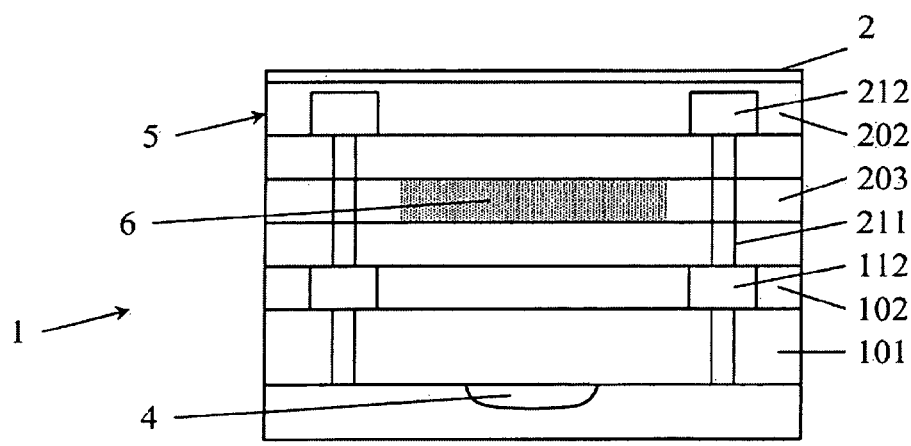
Figure 3:
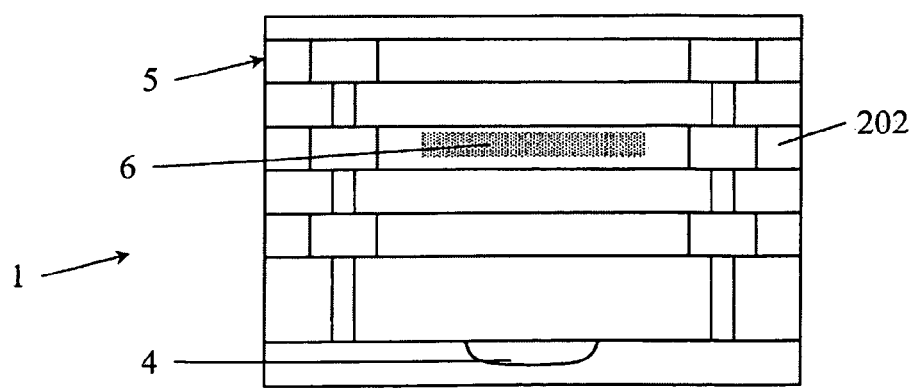
Figure 4:
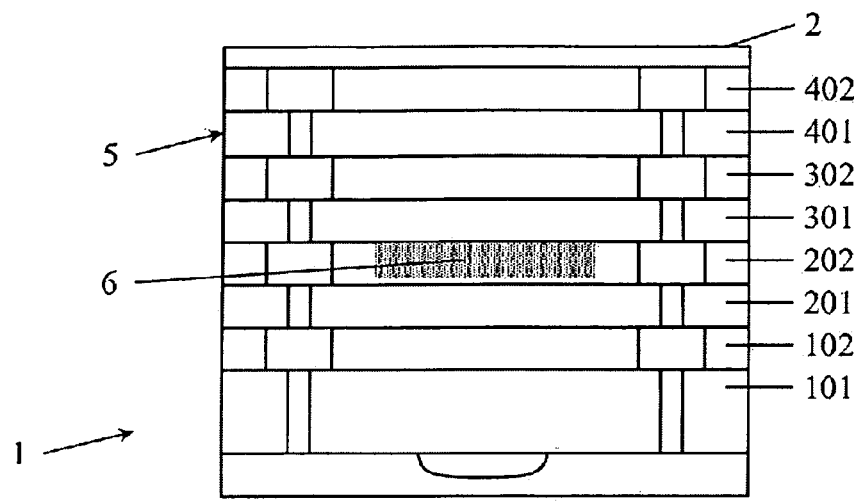
Figure 5:
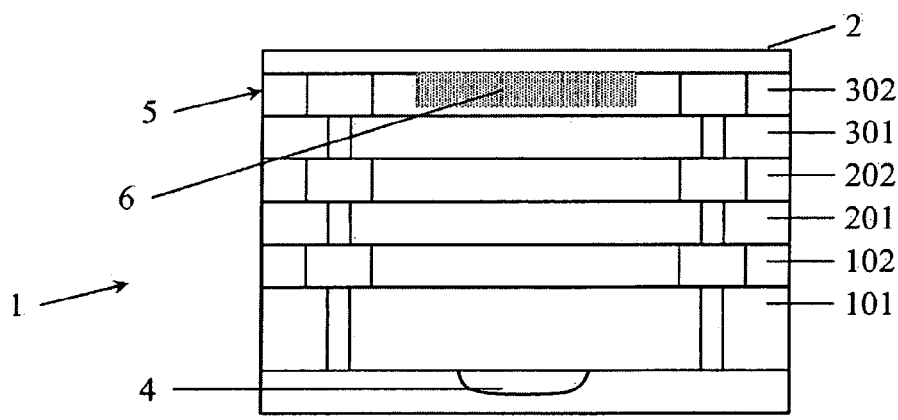
Figure 6:
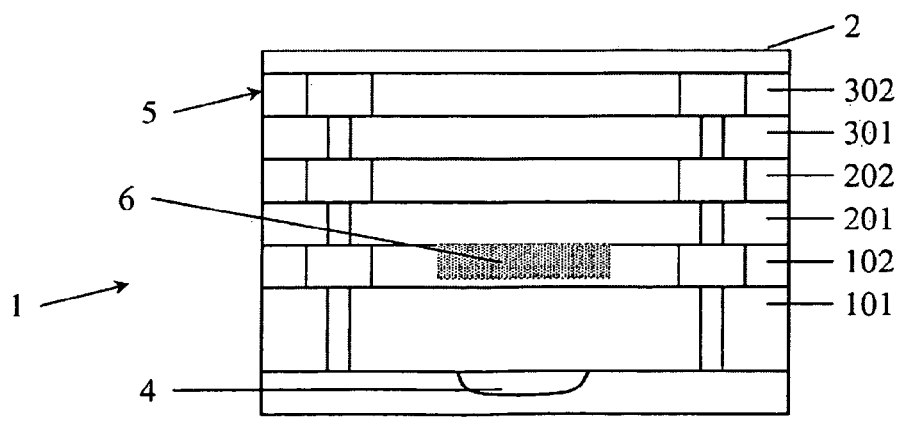
Figure 7:
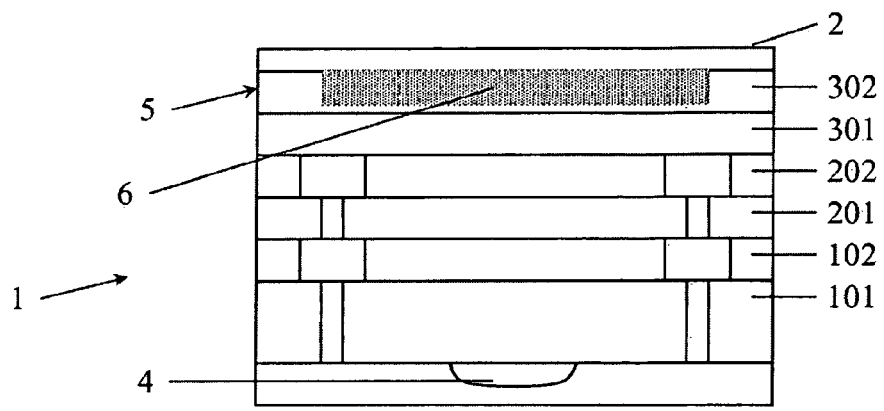
Figure 8:
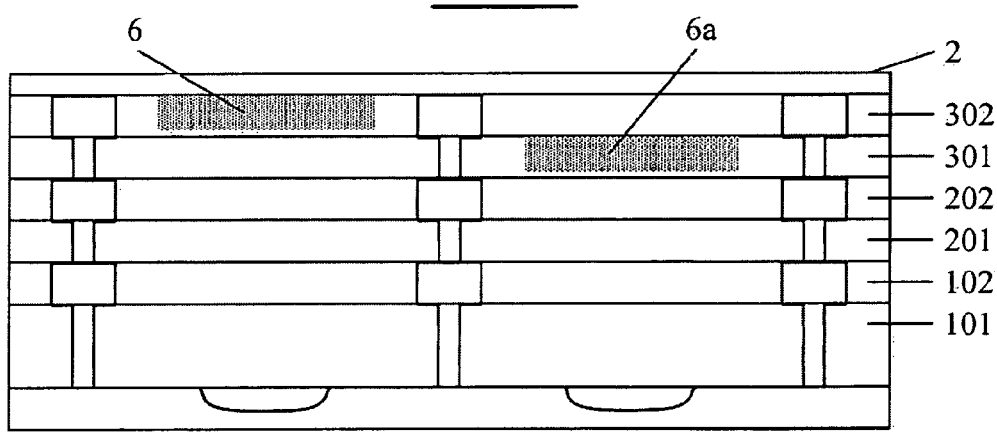
Figure 9:
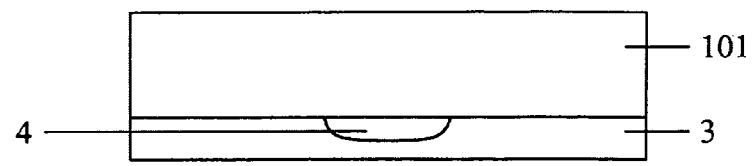
FIGS. 9 to 14 illustrate the steps of a fabrication process.
Figure 10:
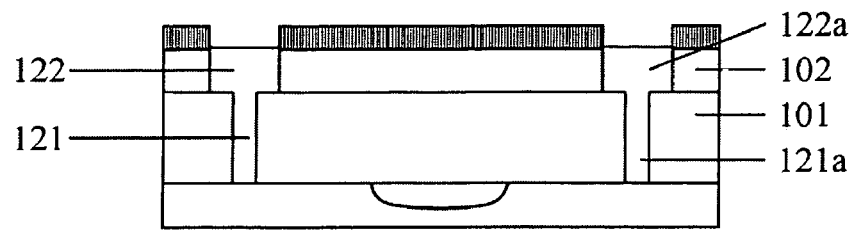
Figure 11:
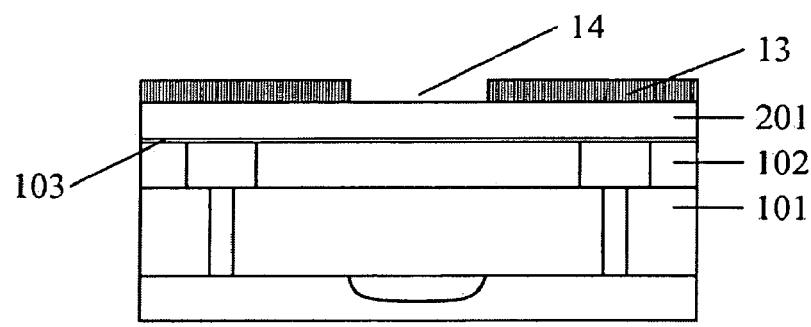
Figure 12:
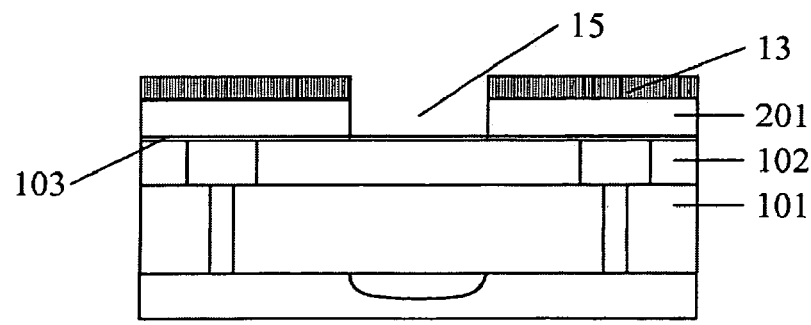
Figure 13:
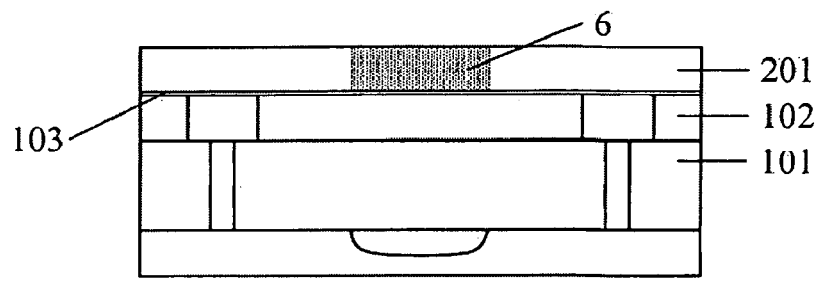
Figure 14:
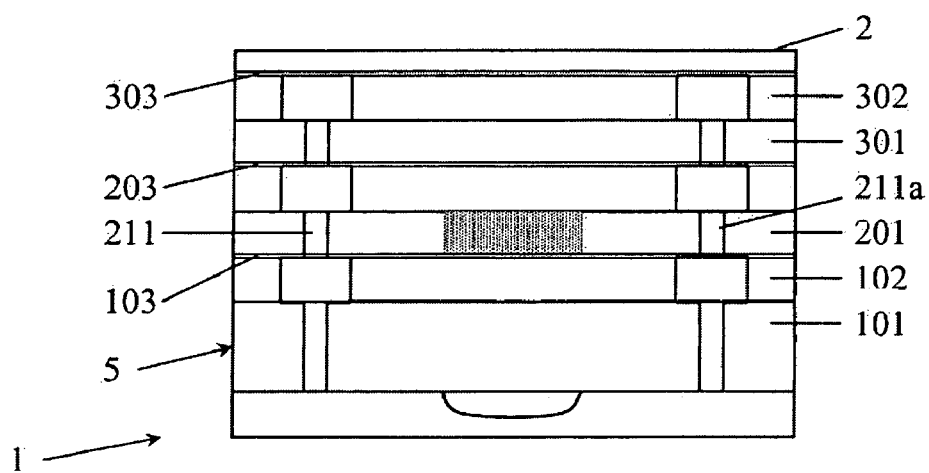
Figure 15:
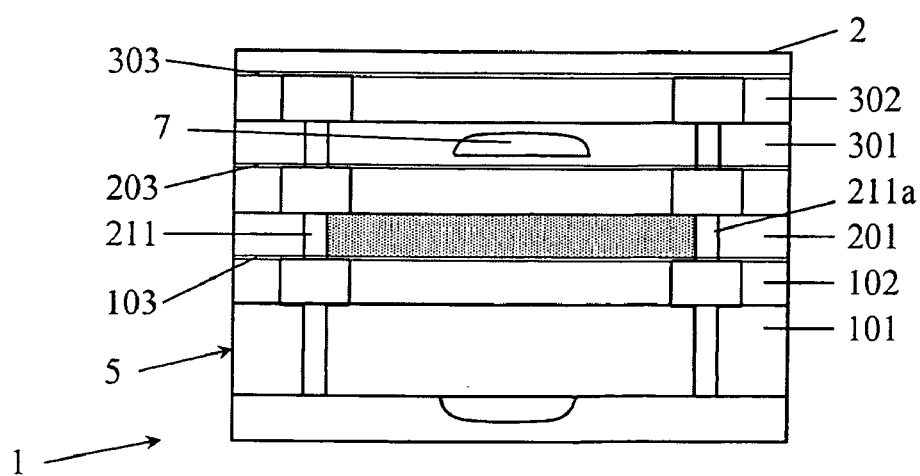

For a more complete understanding of this disclosure and its features, reference is now made to the following description, taken in conjunction with the accompanying drawings, in which:

FIG. 1 illustrates a photosensitive cell forming part of an integrated circuit wafer;

FIG. 2 illustrates a filter placed within the interconnection part and constituting an additional layer of the interconnection part;

FIG. 3 illustrates a filter integrated within the interconnection part and over a portion of the dielectric material;

FIG. 4 illustrates a filter disposed within a metallization level of the interconnection where the filter has a thickness substantially equal to the thickness of the metallization level;

FIG. 5 illustrates a metallization level closest to the input face;

FIG. 6 illustrates a metallization level closest to the photosensitive element;

FIG. 7 illustrates a photosensitive cell having an interconnection part with one metallization level locally devoid of a metal interconnect channel;

FIG. 8 illustrates two photosensitive cells adjacent to one another;

FIG. 9 illustrates a substrate of a portion of integrated circuit having a photosensitive element;

FIG. 10 illustrates an integrated circuit having a second dielectric layer etched to form metal interconnect channels of a metallization level;

FIG. 11 illustrates an integrated circuit formed when the non-opened up part of the photoresist layer is exposed;

FIG. 12 illustrates the dielectric layer etched down to the stopping layer forming cavities;

FIG. 13 illustrates the integrated circuit formed after chemical-mechanical polishing is performed;

FIG. 14 illustrates a photosensitive cell according to one embodiment of the present disclosure; and FIG. 15 illustrates a photosensitive cell according to another embodiment of the present disclosure.

DETAILED DESCRIPTION

In FIG. 1, a photosensitive cell 1 forming part of an integrated circuit wafer in the process of formation comprises, in its upper part, a transparent plate 2 forming the light input face. The plate 2 can be made of glass or of transparent plastic.

In a lower part of the cell 1, a semiconductor substrate 3, disposed substantially parallel to the input face, comprises a photosensitive element 4, for example a photodiode, fabricated at least in part within the substrate. The substrate 3 can, for example, be a silicon substrate.

The cell also comprises an interconnection part 5 situated between the input face 2 and the semiconductor substrate 3, and notably comprising several metallization layers 102, 202, 302, 402. In the example shown, the interconnection part comprises three metallization levels 102, 202, 302, two neighbouring metallization layers being separated by a dielectric layer 201, 301. The cell 1 also comprises a lower dielectric layer 101, situated between the substrate 3 and the interconnection part 5.

The metallization levels 102, 202, 302 comprise metal interconnect channels 112, 212, 312. The metal interconnect channels 112, 212, 312 generally comprise copper and are surrounded by dielectric layers 101, 201, 301 comprising silica. In order to avoid diffusion of the copper into the silica, a layer not shown comprising silicon nitride can be deposited between the metal interconnect channel and the dielectric material.

According to various embodiments, the filter 6 can be placed at various levels within the photosensitive cell 1. In FIG. 1, the filter 6 is placed within the first dielectric layer 101, close to the photosensitive element 4. The proximity of the filter 6 and the photosensitive element 4 allows the overlap of the colours to be very greatly limited. The reason for this is that the light rays passing through the interconnection part 5 associated with the cell 1 have too small an angle of incidence to pass through the filter 6 of the cell 1 and to reach the photosensitive element of a neighbouring cell.

In FIG. 2, the elements similar to those in FIG. 1 carry the same references. The filter 6 is placed within the interconnection part 5. The filter 6 constitutes an additional layer 203 of the interconnection part 5. The additional layer 203 can be formed by the filter 6 surrounded, laterally, by a dielectric material. The additional layer 203 thus formed allows vias 211 to be formed in the dielectric material, away from the filter 6.

Another possibility is to form the filter 6 within the dielectric layer 201 separating two successive metallization levels 102, 202. The height of the stack is then substantially maintained.

In FIG. 3, the elements similar to those in FIG. 1 carry the same references. The filter 6 is, in this example, integrated within the interconnection part 5. The filter 6 is placed within a metallization level 202, over a portion of dielectric material. The portion of dielectric material forms the part of the metallization level 202 via which the light entering into the cell 1 reaches the photosensitive element 4. The embodiment also allows the height of the stack, and hence the aspect ratio, to be reduced.

A variant is shown in FIG. 4. The filter 6 is disposed within a metallization level 202 of the interconnection part 5 and has a thickness substantially equal to that of the metallization level 202. In this embodiment, the height of the stack is also reduced. The metallization level may also be the level 302 closest to the input face 2 as indicated in FIG. 5, or else the level 102 closest to the photosensitive element 4 as indicated in FIG. 6. The actual width of the filter 6 will depend on the metallization level 102, 202, 302 within which the filter 6 is formed.

In FIG. 7, the elements similar to those in FIG. 1 carry the same references. The cell 1 comprises an interconnection part 5 with one metallization level 302 that is locally devoid of metal interconnect channel. Since the unused level 302 is that closest to the input face 2, the width of the filter 6 can be equal to that of the cell 1. This allows the filter 6 to be brought closer to the photosensitive element 4 without reducing its size and therefore to improve the overlap of the colours while at the same time reducing the height of the cell 1.

In FIG. 8, the elements similar to those in FIG. 1 carry the same references. Two adjacent photosensitive cells are shown. The two cells are preferably sensitive to different wavelengths. The filter 6, 6a of each of the cells is disposed at different levels 302, 301 of the interconnection part 5. A first filter 6 is disposed within the metallization layer 302 closest to the input face 2, whereas the second filter 6a is disposed within a dielectric layer 301 separating two metallization levels 202, 302.

FIGS. 9 to 14 show the various fabrication steps of one embodiment. FIG. 9 shows the substrate 3, for example silicon, of a portion of integrated circuit comprising a photosensitive element 4, for example a photodiode. A dielectric layer 101, comprising for example silica, is deposited onto the portion of substrate 3. The layer 101 entirely covers the substrate 3 in addition to the various electronic components not shown that are formed on the surface of the substrate 3.

Subsequently, two holes 121, 121a are formed. The holes 121, 121a are formed for example by means of a photoresist previously opened up under a mask. The etching is performed and the holes 121, 121a are obtained. Then, a layer comprising for example tantalum nitride (TaN) then tantalum (Ta) can be deposited onto the walls of the holes before depositing the conducting material onto them, in particular when the conducting material comprises copper. The integrated circuit is then polished by a chemical-mechanical polishing process. A second dielectric layer 102 is then deposited. In an analogous manner, the dielectric layer 102 is etched in order to form the metal interconnect channels 122, 122a of the first metallization layer 102. The integrated circuit shown in FIG. 10 is thus obtained.

After deposition of a layer 103 comprising silicon nitride, the dielectric layer 201 is again deposited. A photoresist 13 is deposited onto the said dielectric layer 201 then is opened up at the location 14 where the filter 6 is to be placed. The non-opened-up part of the photoresist 13 is exposed in order to obtain the circuit such as is shown in FIG. 11.

The dielectric layer 201 is etched down to the stopping layer 103. A cavity 15 shown in FIG. 12 is then obtained which will allow the filter 6 to be accommodated. The photoresist 13 is then removed and the filter 6 is deposited in the form of a sol-gel, by centrifugation. A chemical vapour deposition (CVD) of the metal oxide glass is also possible. Once the sol-gel has been deposited into the cavity 15, the integrated circuit is annealed at 400° C. in order to densify the sol-gel. The annealing process allows the organic solvent of the sol-gel to be evaporated leaving the metal oxide glass.

The metal oxide glass is chosen so as to have optical properties (transmission, absorption) that are analogous before and after a thermal processing carried out at a temperature below 600-700° C. In this way, the optical properties of the filter will be little or un-altered by the thermal processing steps that will take place after its deposition within the integrated circuit, for example during the steps for forming the metallization levels 202, 302 situated above the filter. On the other hand, this is not the case for filters comprising a photoresist since they are deteriorated by the high temperatures used during the fabrication of the metallization levels.

The surface of the integrated circuit is subject to a chemical-mechanical polishing. The circuit shown in FIG. 13 is obtained. Then, the vias just need to be formed and the previous steps reiterated in a conventional manner in order to obtain the complete interconnection part 5 and to finish the photosensitive cell 1. When it is finished, the latter will then have a height that is lower than a cell with a filter deposited on top, and it will have a reduced colour overlap thanks to the presence of the filter within a layer of the interconnection part close to the photosensitive element. The cell is shown in FIG. 14.

Thus, the filter 6 is formed within the interconnection part 5 or between the photosensitive element 4 and the interconnection part 5. The risk of overlapping of the colours is then reduced thanks to the proximity of the filter 6 to the photosensitive element 4 and thanks to a reduction in the height of the cell 1. The reflexions by the metal of the metallization levels also occurred before the light ray passes through the filter. Thus, the risk of overlapping of the colors is again reduced. The filter 6 formed in a glass allows the desired optical properties to be maintained despite the use of high temperatures. This facilitates the integration of the filter formation step into the process for fabricating the interconnection part 5 of the cell. Advantageously, the filter 6 is placed within the first dielectric layer 201 disposed on the photosensitive element 4. In this manner, the light rays detected by the photosensitive element 4 have a higher probability of having passed through the filter 6 before reaching the photosensitive element 4. Moreover, the width of the filter can be chosen to be smaller, thus reducing the size of the filter 6 within the cell 1.

In another embodiment, the filter may be formed with a transparent dielectric material doped with transition metal cation. For instance, the transparent dielectric material may be chosen among ZnO, $Al_2O_3$, $TiO_2$, $ZrO_2$ or $Y_2O_3$. These examples of materials are transparent and have a refraction index between 1.7 and 2.0. The transparent dielectric material is doped with transition metal cation chosen among $Co^{2+}$, $Cu^{2+}$, $Cr^{3+}$, $Mn^{2+}$, $Mn^{3+}$, $Ti^{3+}$, $V^{4+}$, $V^{3+}$, $V^{2+}$, $Fe^{3+}$, $Fe^{2+}$ or $Ni^{2+}$ in order to select the color filtered by the filter. The choice of the transition metal cation, of the dopant level and of the transparent dielectric material allows to change the transmission color. For instance: to get a red filter, the material may be: ZnO doped with $Mn^{2+}$, or $Zn_xTi_yO_v\text{-}wN_z$; to get a green filter, it is possible to choose ZnO doped with 25% $Co^{2+}$, or $Al_2O_3$ doped with $Cr^{3+}$, and to get blue filter, it is possible to choose $Al_2O_3$ doped with 20% $Co^{2+}$, or $ZnAl_2O_4$ doped with $Co^{2+}$.

These kinds of materials ("doped transparent material") may be deposited, for instance, by MOCVD (metal-organic chemical vapor deposition) or PEMOCVD (plasma-enhanced metal-organic chemical vapor deposition). In particular, when the filter comprises a doped transparent material, it is no more necessary to do an annealing step at 400° C. since the material of the filter is not in the form of a sol-gel.

Thanks to the doped transparent materials, the optical properties (transmission, absorption) are analogous before and after a thermal processing carried out at a temperature above 500° C. In this way, the optical properties of the filter will be little or un-altered by the thermal processing steps that will take place after its deposition within the integrated circuit, for example during the steps for forming the metallization levels 202, 302 situated above the filter, or during the annealing step at 450° C. under hydrogen performed to improve the quality of the interfaces silicon/silicon oxide of the integrated circuit. Moreover, the thickness of the filter according to the present embodiment is smaller than the one of the photoresist filters, for instance between 100 nm and 1 μm, allowing a reduction of the height of the stack.

In order to reduce the height of the stack, it is also possible to put the microlens within the interconnect part. As illustrated in FIG. 15, the microlens 7 may be integrated in the dielectric layer 301 of the interconnect part 5. It is also possible to put the microlens in any other dielectric layer or metallization level situated above the filter, for instance in metallization level 202 or 302 of the interconnect part 5.

In this disclosure, 'input face associated with the photosensitive element' is understood to be the end of the cell whose illumination is to be measured by the said photosensitive element. The cell is thus situated between the substrate composed of a semiconductor material comprising at least, in part, the photosensitive element and the input face.

The filter formed under the surface of the interconnection part situated on the input face side is closer to the photosensitive element of the cell. The purpose of this is to limit the overlap of colors since the light rays passing through the filter reach the photosensitive element more quickly and can less easily stray into an adjacent cell. In other words, the filter occupies a greater proportion of the solid angle of the photosensitive element.

The filter can thus be disposed within the interconnection part. For example, the optical filter can be disposed within a dielectric layer belonging to the interconnection part, or else within a metallization level belonging to the interconnection part. In particular, the optical filter can be disposed within the metallization level furthest from or nearest to the photosensitive element. In addition to the proximity of the filter to the photosensitive element, a reduction in the height of the stack formed by the photosensitive cell and the filter is also obtained. A part of the dielectric material forming the interconnection part and through which the light passes is replaced by the filter with substantially constant thickness of the interconnection part. This allows the overlap of the colors to be limited, on the one hand, owing to the proximity of the filter and, on the other, by the reduction in the aspect ratio of the cell.

According to another embodiment, the optical filter is disposed within the interconnection part so as to straddle, at least in part, an interconnect channel situated at another metallization level. In particular, the embodiment allows levels of the interconnection part locally devoid of metal interconnect channels to be used, notably when the elements neighboring the photosensitive cells require more metallization levels than the said photosensitive cells. In this case, the interconnection part situated between the photosensitive element and the input face contains levels that are unused by the cell but which increase the aspect ratio of the latter. The existence of these levels can thus be used to advantage.

According to another embodiment, the optical filter is disposed between the photosensitive element and the interconnection part.

Advantageously, the optical filter comprises a metal oxide glass or cerium sulfide. The oxide is chosen in such a manner as to select the desired wavelength within the cell and, in particular, it comprises at least one of the oxides chosen from the group formed by iron, chromium, cobalt, cadmium and/or manganese oxides.

Advantageously, the metal oxide glass used as a filter has a softening temperature greater than 350° C. The filter can be positioned within the interconnection part and its fabrication can be integrated into the process while still keeping the passivation steps or the anneal temperatures. The filter can be positioned more easily within the photosensitive cell and will not prevent the steps that follow its deposition.

The disclosure also relates to the matrices formed by a plurality of photosensitive cells such as have been previously described. In particular, the various filters associated with the various cells can advantageously be deposited in different metallization levels depending on the wavelength selected by the filter or else the location of the cell within the matrix.

In some embodiments, the possibility of depositing the filters in different metallization levels allows a greater freedom in the formation of the matrix. Another advantage is the possibility of reducing the width of the filter when the distance separating it from the photosensitive element is shorter. In actual fact, the size of the filter does not need to be much larger than that of the photosensitive element if the latter is situated just underneath the filter. In order to obtain the desired detection, as many light rays as possible that pass through the filter should be made to reach the photosensitive element and as few other rays as possible should be allowed to reach the photosensitive element. When the filter is situated on top of the interconnection part, one way of limiting the color overlap is to make the filter as wide as possible, the width being limited by the size of the photosensitive cell itself. When the filter is brought closer to the photosensitive element, the width of the filter can be reduced without increasing the color overlap. In particular, the straddling by the filter of one or more interconnect channels formed in different metallization levels is favored when the filter is situated on the side of the interconnection part close to the input face. When the filter is situated on the side of the interconnection part close to the photosensitive element, a filter width similar to that of the photosensitive element may suffice. It then becomes easier to dispose the filter between the various elements required for the operation of the cell, such as the connection channels.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An integrated circuit comprising:
   at least one photosensitive cell comprising:
      a photosensitive element;
      an input face associated with the photosensitive element;
      an optical filter situated in at least one optical path leading to the photosensitive element; and
      an interconnection part disposed between the photosensitive element and the input face, said interconnection part comprising at least two metallization levels separated by a dielectric layer,
      wherein the optical filter is disposed within the interconnection part, between the photosensitive element and the metallization layer of the interconnection part closest to the input face.

2. The integrated circuit according to claim 1, wherein the optical filter is disposed within the dielectric layer belonging to the interconnection part.

3. The integrated circuit according to claim 1, wherein the optical filter is disposed within one of the at least two metallization levels belonging to the interconnection part.

4. The integrated circuit according to claim 3, wherein the optical filter is disposed within the metallization level nearest to the photosensitive element.

5. The integrated circuit according to claim 1, wherein the optical filter straddles, at least in part, a conducting interconnect channel situated at another metallization level.

6. The integrated circuit according to claim 1, wherein the optical filter is disposed between the photosensitive element and the interconnection part.

7. The integrated circuit according to claim 1, wherein the optical filter comprises metal oxide glass or cerium sulphide.

8. The integrated circuit according to claim 7, wherein the metal oxide comprises at least one of: an oxide of iron, an oxide of chromium, an oxide of cobalt, and oxide of cadmium and an oxide of manganese.

9. The integrated circuit according to claim 1, wherein the optical filter comprises transparent dielectric material doped with transition metal cation.

10. The integrated circuit according to claim 9, wherein the transition metal cation is chosen among $Co^{2+}$, $Cu^{2+}$, $Cr^{3+}$, $Mn^{2+}$, $Mn^{3+}$, $Ti^{3+}$, $V^{4+}$, $V^{3+}$, $V^{2+}$, $Fe^{3+}$, $Fe^{2+}$, $Ni^{2+}$.

11. The integrated circuit according to claim 1 wherein a microlens is disposed within the interconnection part, between the optical filter and the surface of the interconnection part closest to the input face.

12. The integrated circuit according to claim 1 further comprising:
a plurality of photosensitive cells disposed in a matrix configuration.

13. The integrated circuit according to claim 12, wherein the optical filters of the various photosensitive cells are located within the at least two metallization levels.

14. A plurality of photosensitive cells disposed in a matrix configuration, each of the photosensitive cells comprising:
a photosensitive element;
an input face associated with the photosensitive element;
an optical filter situated in at least one optical path leading to the photosensitive element; and
an interconnection part disposed between the photosensitive element and the input face and comprising at least two metallization layers separated by a dielectric layer, wherein the optical filter is disposed between the photosensitive element and the metallization layer of the interconnection part closest to the input face,
wherein the optical filters of the various photosensitive cells are located within the interconnection part, within at least two different metallization levels.

15. The photosensitive cell according to claim 14, wherein the optical filter is disposed within a dielectric layer belonging to the interconnection part.

16. The photosensitive cell according to claim 14, wherein the optical filter straddles, at least in part, a conducting interconnect channel situated at another metallization level.

17. The photosensitive cell according to claim 14, wherein the optical filter is disposed between the photosensitive element and the interconnection part.

18. The photosensitive cell according to claim 14, wherein the optical filter comprises a metal oxide, glass or cerium sulphide.

19. The photosensitive cell according to claim 18, wherein the metal oxide comprises at least one of: an oxide of iron, an oxide of chromium, an oxide of cobalt, and oxide of cadmium and an oxide of manganese.

20. The photosensitive cell according to claim 14, wherein the optical filter comprises transparent dielectric material doped with transition metal cation.

21. The photosensitive cell according to claim 20, wherein the transition metal cation is chosen among $Co^{2+}$, $Cu^{2+}$, $Cr^{3+}$, $Mn^{2+}$, $Mn^{3+}$, $Ti^{3+}$, $V^{4+}$, $V^{3+}$, $V^{2+}$, $Fe^{3+}$, $Fe^{2+}$, $Ni^{2+}$.

22. The photosensitive cell according to claim 14 wherein a microlens is disposed within the interconnection part, between the optical filter and the surface of the interconnection part closest to the input face.

* * * * *